United States Patent
Ueda (10) Patent No.: US 8,624,677 B2
(45) Date of Patent: Jan. 7, 2014

(54) SEMICONDUCTOR DEVICE

(75) Inventor: Naohiro Ueda, Hyogo (JP)

(73) Assignee: Ricoh Company, Ltd, Tokyo (JP)

( * ) Notice: Subject to any disclaimer, the term of this patent is extended or adjusted under 35 U.S.C. 154(b) by 0 days.

(21) Appl. No.: 13/416,619

(22) Filed: Mar. 9, 2012

(65) Prior Publication Data
US 2012/0235751 A1    Sep. 20, 2012

(30) Foreign Application Priority Data
Mar. 16, 2011   (JP) ................................ 2011-058384

(51) Int. Cl.
*H03F 3/14*    (2006.01)
(52) U.S. Cl.
USPC ........................................................ 330/307
(58) Field of Classification Search
USPC .......... 330/250, 277, 307; 257/672, 676, 787, 257/788, 791
See application file for complete search history.

(56) References Cited

U.S. PATENT DOCUMENTS

| | | | | |
|---|---|---|---|---|
| 4,553,098 A | * | 11/1985 | Yoh et al. | 330/253 |
| 6,690,226 B2 | * | 2/2004 | Takai | 327/530 |
| 7,098,699 B2 | * | 8/2006 | Tamura et al. | 330/258 |
| 7,301,315 B2 | * | 11/2007 | Noda | 330/257 |
| 7,986,188 B2 | * | 7/2011 | Fujiwara | 330/257 |
| 2010/0072589 A1 | * | 3/2010 | Camacho et al. | 257/676 |

FOREIGN PATENT DOCUMENTS

| | | |
|---|---|---|
| JP | 6-97368 | 4/1994 |
| JP | 10-189875 | 7/1998 |
| JP | 11-145344 | 5/1999 |

* cited by examiner

*Primary Examiner* — Khanh V Nguyen
(74) *Attorney, Agent, or Firm* — Cooper & Dunham LLP (57) ABSTRACT

A semiconductor device includes a semiconductor chip in which an internal circuit is formed, with the internal circuit having an output signal that fluctuates due to variation of fluctuation in electrical characteristics of multiple circuit elements constituting the internal circuit; a chip tab on which the semiconductor chip is mounted, with the semiconductor chip completely overlapping the chip tab and the circuit elements in the semiconductor chip arranged on the chip tab, and encapsulation resin within which the semiconductor chip and the chip tab are sealed. A horizontal surface area of the chip tab is smaller than that of the semiconductor chip, and a distance between a periphery of the chip tab and a periphery of the semiconductor chip is sufficient to cause stress exerted on the semiconductor chip by the encapsulation resin to be uniform across the horizontal surface area of the chip tab.

14 Claims, 6 Drawing Sheets

SEMICONDUCTOR DEVICE

CROSS-REFERENCE TO RELATED APPLICATION

This patent application is based on and claims priority pursuant to 35 U.S.C. §119 to Japanese Patent Application No. 2011-058384, filed on Mar. 16, 2011 in the Japan Patent Office, the entire disclosure of which is hereby incorporated by reference herein.

BACKGROUND

1. Technical Field

The present disclosure relates to a semiconductor device, and more particularly, to a semiconductor device that employs a semiconductor chip in which an internal circuit is formed, a chip tab mounting the semiconductor chip, and encapsulation resin to encapsulate the semiconductor chip and the chip tab.

2. Description of the Background Art

Portable electronic devices such as mobile phones and digital cameras are ubiquitous. The integrated circuits (IC) used in these portable electronic devices are required to be made more compact and with a higher degree of accuracy. Market demand for rigorous accuracy is particularly intense, with some market sectors seeking tolerance guarantees of from 1% to 0.5% or even less. As used herein, the term "tolerance" means deviation in performance of an actually manufactured IC from that of an IC that is formed according to design without dimensional error.

Although it is difficult to treat such tolerances as a whole because there are many different types, in general they can be divided into two major groups depending on the stage of IC manufacture in which they occur.

The first type of tolerance is one that arises during processing of a semiconductor wafer. When the semiconductor wafer is processed and target circuit elements are constructed therein, the dimensions of the circuitry and the degree of impurity may deviate slightly from design values therefor. The first type of tolerance is caused by deviations in processing, which typically follows a normal distribution curve.

The first type of tolerance can be reformed by improving the characteristics of production equipment because the first type of tolerance is caused by processing deviation. In addition, a circuit design method in which a circuit area having a larger size such that processing deviation is not a problem is aggressively used for circuits requiring a high degree of accuracy.

Figure 1:
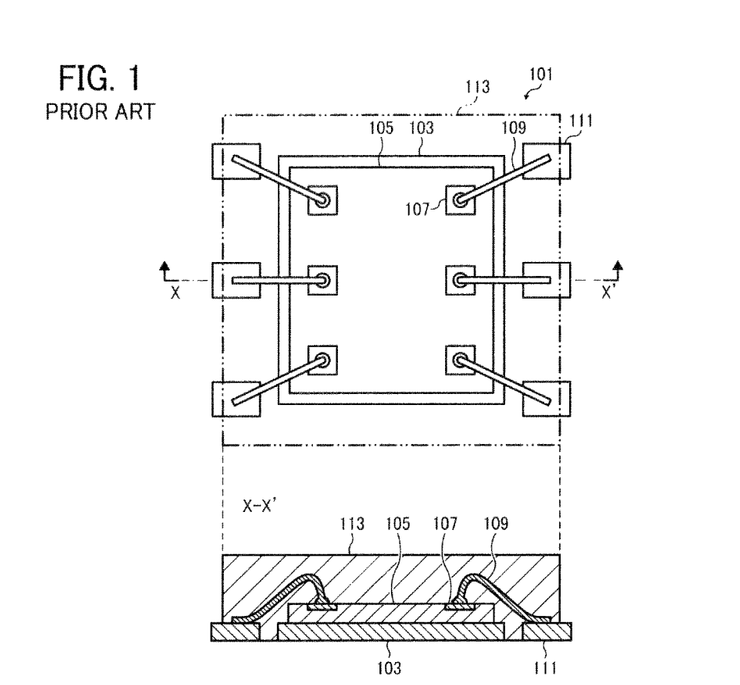
FIG. 1 is a schematic plan view and a cross-sectional diagram illustrating a conventional semiconductor device.

The second type of tolerance is generated when a completed semiconductor wafer is cut into chips and each chip is inserted in a container so-called, a package, as an individuated pack. FIG. 1 is a schematic plan view and a cross-sectional diagram illustrating a conventional semiconductor device (IC) 101. In FIG. 1, reference numerals 103 represents a chip tab, 105 represents a semiconductor chip, 107 represent electrode pads, 109 represent bonding wires, 111 represent leads, and 113 represents encapsulation resin. With reference to FIG. 1, the second type of tolerance is generated when the semiconductor chip 105 cut from the semiconductor wafer is encapsulated by the encapsulation resin 113, and a mechanical stress (hereinafter just "stress") is exerted on the semiconductor chip 105. This stress, called package stress, skews and deforms the semiconductor chip 105. Owing to the deformation, the electrical characteristics of the circuit elements formed in the semiconductor chip 105 are changed, thereby changing an output signal of the IC 101.

Figure 2:
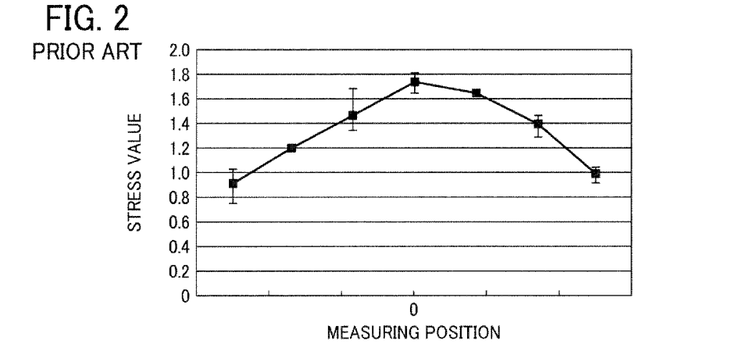
FIG. 2 is a graph illustrating stress exerted on a semiconductor chip of the conventional semiconductor device shown in FIG. 1.

FIG. 2 is a graph illustrating stress exerted on the semiconductor chip 105. In FIG. 2, a vertical axis indicates a stress value (orbital unit), and a horizontal axis indicates a measurement positions representing a distance from a center when the center of the semiconductor chip is set to zero. In the conventional semiconductor device 101, the package stress exerted on the semiconductor chip 105 is largest in a center position thereof and is decreased toward a periphery of the semiconductor chip 105. Since the package stress is simply changed from the center position to the periphery of the semiconductor chip 105, there is no area in which the strength of the package stress is constant.

Several approaches have been proposed for alleviating tolerances arising from package stress. For example, JP H11-145344-A discloses a method that circuit element (e.g., transistor) to be prevented from fluctuation in the electronic characteristics caused by the package stress is arranged in a center position of a chip.

In addition, JP-H10-189875-A discloses a method in which circuit elements (e.g., resistors) to be prevented from fluctuation in electrical characteristics caused by package stress are arranged near a periphery of the chip. In general, the package stress is smallest in the periphery of the semiconductor chip. At the same time, however, localized changes in the package stress are often greatest in the periphery of the semiconductor chip. As a result, fluctuation in the output signal of the IC caused by package stress cannot be solved.

Further, JP-H06-097368-A discloses an approach in which paired circuit elements to be arranged on lines radiating outward from the center (center of gravity) of the chip toward the periphery to equalize package stress. However, this method does not always achieve the expected result, because the strength and the direction of the package stress is affected by the size of the semiconductor chip, the package shape (shape of the encapsulation resin), and the relative positions of the semiconductor chip and the encapsulation resin.

As described above, with the conventional approaches fluctuation in the electrical characteristics of the circuit elements caused by the package stress cannot be eliminated or made uniform, and consequently fluctuation in the output signal caused by the package stress cannot be solved.

BRIEF SUMMARY

In one aspect of this disclosure, there is a provided a semiconductor device including a semiconductor chip, a chip tab, and encapsulation resin. An internal circuit is formed in the semiconductor chip, with the internal circuit having an output signal that fluctuates due to variation of fluctuation in electrical characteristics of multiple circuit elements constituting the internal circuit. The semiconductor chip is mounted on the chip tab, with the semiconductor chip completely overlapping the chip tab and the circuit elements in the semiconductor chip arranged on the chip tab. The semiconductor chip and the chip tab are sealed within the encapsulation resin. A horizontal surface area of the chip tab is smaller than that of the semiconductor chip. A distance between a periphery of the chip tab and a periphery of the semiconductor chip is sufficient to cause stress exerted on the semiconductor chip by the encapsulation resin to be uniform across the horizontal surface area of the chip tab.

BRIEF DESCRIPTION OF THE DRAWINGS

The aforementioned and other aspects, features and advantages are better understood by reference to the following detailed description when considered in connection with the accompanying drawings, wherein.

DETAILED DESCRIPTION OF PREFERRED EMBODIMENTS

In describing preferred embodiments illustrated in the drawings, specific terminology is employed for the sake of clarity. However, the disclosure of this patent specification is not intended to be limited to the specific terminology so selected, and it is to be understood that each specific element includes all technical equivalents that operate in a similar manner and achieve a similar result. Referring now to the drawings, wherein like reference numerals designate identical or corresponding parts throughout the several views, particularly to FIGS. 3 through 11, semiconductor devices according to illustrative embodiments are described.

First Embodiment

Figure 3:
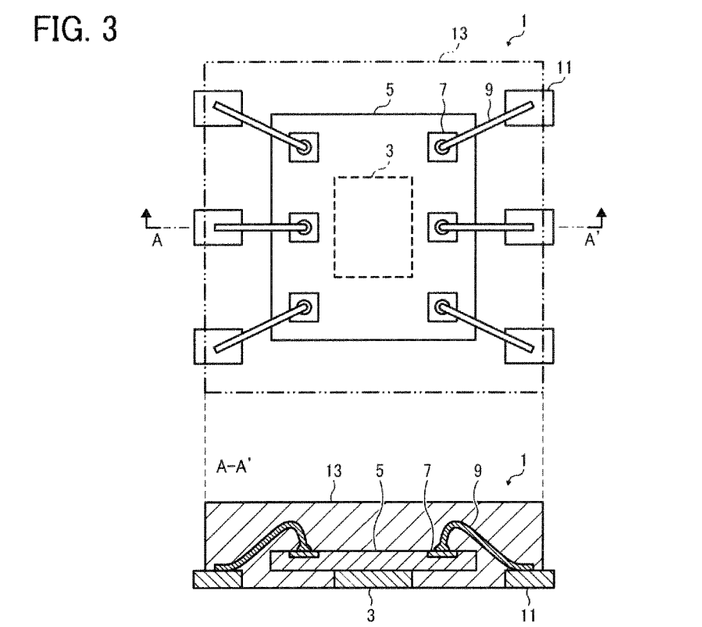
FIG. 3 is a schematic plan view and a cross-sectional diagram illustrating a semiconductor device according to a first embodiment of the present disclosure.

FIG. 3 is a schematic plan view and a cross-sectional diagram illustrating a semiconductor device 1 according to the present embodiment. The cross-sectional diagram of FIG. 3 shows the semiconductor device 1 along a line A-A' of the plan view in FIG. 3. In the plan view of FIG. 3, an encapsulation resin 13 is represented by a vertical line (two-dot chain line). In the semiconductor device 1, a semiconductor chip 5 is mounted on a chip tab 3. Electrode pads 7 are provided on an upper surface of the semiconductor chip 5, on a side of the semiconductor chip 5 away from the chip tab 3. The electrode pads 7 are electrically connected to leads 11 through bonding wires 9, respectively. The chip tab 3, the semiconductor chip 5, the bonding wires 9, inner lead portions of the leads 11 are resin sealed within the encapsulation resin 13.

A horizontal surface area of the chip tab 3 is smaller than that of the semiconductor chip 5. When viewed from above, the semiconductor chip 5 and the chip tab 3 are placed so that the semiconductor chip 5 completely overlaps the chip tab 3. A periphery of the chip tab 3 is positioned at a certain interval from the periphery of the semiconductor chip 5 so that package stress caused by the encapsulation resin 13 exerted on the semiconductor chip 5 is uniform across the chip tab 3.

Herein, the chip tab is a base on which the semiconductor chip is placed when the semiconductor chip is sealed within the encapsulation resin. The horizontal surface area of the semiconductor chip is an external outline of the semiconductor chip when viewed from above (circuit formation side), that is, the size of the semiconductor chip occupying two-dimensionally. The horizontal surface area of the chip tab is a size of a mounting face of the chip tab, on a side of the chip tab facing the semiconductor chip, occupying two-dimensionally.

In addition, stress is a physical quantity used for strengths and directions of internal forces acting within a deformable material body, which is "stress tensor". The stress tensor (stress tensor using infinitesimal deformation theory) is represented by following formula 1.

$$\sigma = \begin{pmatrix} \sigma_{xx} & \sigma_{xy} & \sigma_{xz} \\ \sigma_{yx} & \sigma_{yy} & \sigma_{yz} \\ \sigma_{zx} & \sigma_{zy} & \sigma_{zz} \end{pmatrix} \quad (1)$$

In the formula 1, nine components $\sigma_{ij}$ of the stress vectors defines the states of stress at given points. A first index x denotes that the stress acts on a plane normal to a minute plane, and a second index y denotes a direction in which the stress acts on the minute plane. For example, xy means that the normal direction of the minute surface corresponds to X-axis direction, and the force component corresponds to the Y axis direction. The stress at any point in an object, assumed to behave as a continuum, is completely defined by nine component stresses: three orthogonal normal stresses ("normal stresses": xx, yy, and zz) and six orthogonal shear stresses ("shear stress": xy, xz, yx, yz, zx, and zy) that the normal line of the minute face differs from the stress of action.

The "normal" stress serves as "tensile stress" or "compressive stress". The "tensile stress" acts when acting outward from the plane, that is, a direction of acting plane is orthogonal to a direction of the acting force, and the tensile stress is exerted in a direction in which the acting plane is pulled. The "compressive stress" acts when acting inward to the plane, that is, the compressive stress is exerted in a direction in which the acting plane is pressed into. The "stress" used in the present disclosure to predict the characteristic fluctuation in the circuit elements, means the "normal stress".

In addition, "the package stress is uniform" means that the fluctuation in the output signal of the internal circuit is uniform in a state in which the variation is vanishingly small, when the electrical characteristics of the circuit elements fluctuate due to the package stress, in the internal circuit whose output signal fluctuates due to the variations of the fluctuation in the electrical characteristics of the multiple circuit elements constituting the internal circuit.

An internal circuit is formed in the semiconductor chip 5 of the semiconductor device 1. An output signal of the internal circuit fluctuates due to variation of fluctuation in electrical characteristics of multiple circuit elements constituting the internal circuit. These circuit elements in the semiconductor chip 5 of the semiconductor device 1 are arranged on the area of the chip tab 3.

Herein, the circuit elements mean elements build in the semiconductor chip, such as, respective transistors and resistors. The output signal from the internal circuit of the semiconductor chip means a voltage or a current from an output terminal of the internal circuit.

Figure 4:
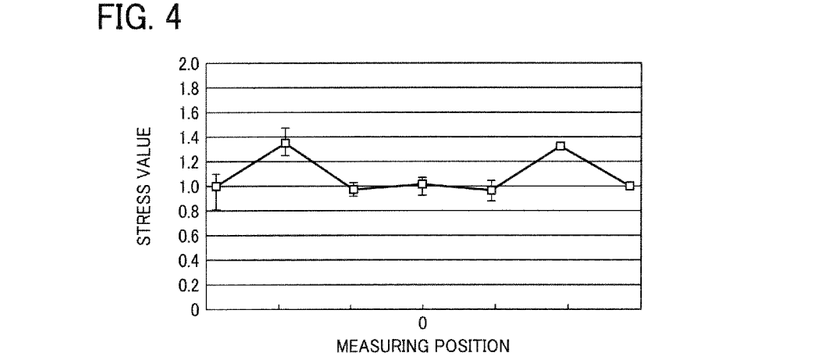
FIG. 4 is a graph illustrating stress exerted on a semiconductor chip of the semiconductor device shown in FIG. 3.

FIG. 4 is a graph illustrating stress exerted on the semiconductor chip 5 of the semiconductor device 1 according to the present disclosure. In FIG. 4, a vertical axis indicates a stress value (orbital unit), and a horizontal axis indicates a measurement positions representing a distance from a center when the center of the semiconductor chip 5 is set to zero. In the semiconductor device 1, distribution of strength of the package stress exerted on the semiconductor chip 5 is effected from the chip tab 3, the package stress in a portion of the semiconductor chip 5 that overlaps the chip tab 3 is made uniform at a predetermined strength.

The electrical characteristics of multiple circuit elements arranged on the chip tab 3 fluctuates because the multiple circuit elements arranged on the chip tab 3 are subjected to the package stress. As illustrated in FIG. 4, as the strength of the package stress exerted on the semiconductor chip 5 mounted on the chip tab 3 is made uniform, the multiple circuit elements arranged on the chip tab 3 and designed to have same structures and same electrical characteristics is affected by being subjected to the same package stress, and the electric characteristics may fluctuate by the same amount, respectively. Accordingly, in the present embodiment, in the internal circuit in which the output signal of the internal circuit due to variations of the fluctuation in the electrical characteristics of multiple circuit elements constituting the internal circuit, fluctuation in the output signal caused by the package stress does not occur. As described above, in the internal circuit in which the output signal of the internal circuit fluctuates due to variation of fluctuation in electrical characteristics of multiple circuit elements, fluctuation in the output signal caused by the package stress can be prevented.

Second Embodiment

Figure 5:
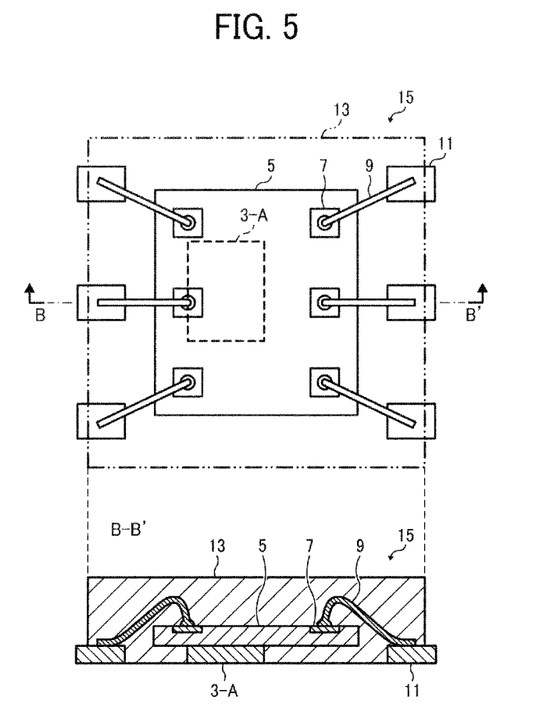
FIG. 5 is a schematic plan view and a cross-sectional diagram illustrating a semiconductor device according to a second embodiment of the present disclosure.

FIG. 5 is a schematic plan view and a cross-sectional diagram illustrating a semiconductor device 15 according to a second embodiment. The cross-sectional diagram of FIG. 5 shows the semiconductor device along a line B-B' of the plan view in FIG. 5. In the plan view of FIG. 5, the encapsulation resin 13 is represented by a vertical line (two-dot chain line). The components in FIG. 5 identical to that in FIG. 3 are represented by same numerals. In the present embodiment, a position of the chip tab 3-A shown in FIG. 5 is different from that of the chip tab 3 according to the first embodiment. In the semiconductor device 1 illustrated in FIG. 3, a center of gravity of the chip tab 3 is coincide with that of the semiconductor chip 5. By contrast, in the semiconductor device 15 illustrated in FIG. 5, the center of gravity of the chip tab 3-A is offset from that of the semiconductor chip 5.

In the semiconductor device 15, a horizontal surface area of the chip tab 3-A is smaller than that of the semiconductor chip 5. When viewed from above, the semiconductor chip 5 and the chip tab 3-A are placed so that the semiconductor chip 5 completely overlaps the chip tab 3-A. In addition, a periphery of the chip tab 3-A is positioned at a certain interval from the periphery of the semiconductor chip 5 so that package stress exerted on the semiconductor chip 5 caused by the encapsulation resin 13 is uniform across the chip tab 3. Therefore, the configuration of the semiconductor device 15 can achieve effects similar to those of the semiconductor device 1 described above even when the center of gravity of the chip tab 3-A is offset from that of the semiconductor chip 5.

As described above, in the configuration in which the semiconductor chip 5 and the chip tab 3(3-A) are placed so that the semiconductor chip 5 completely overlaps the chip tab 3(3-A), and the periphery of the chip tab 3(3-A) is positioned at a sufficient interval from the periphery of the semiconductor chip 5, the strength of the package stress is uniform across the chip tab 3. In the above-descried embodiments, the chip tab 3(3-A) and the semiconductor chip 5 is placed so that the strength of the package stress is uniform across the chip tab 3, and the multiple circuit elements constituting the internal circuits are arranged on the chip tab 3. As a result, the electrical characteristics of the multiple circuit elements constituting the internal circuits fluctuate by being subjected to uniform strength of the package stress, and the fluctuation in the multiple circuit elements are not varied but uniform thereamong.

Configurations of Internal Circuit

Figure 6:
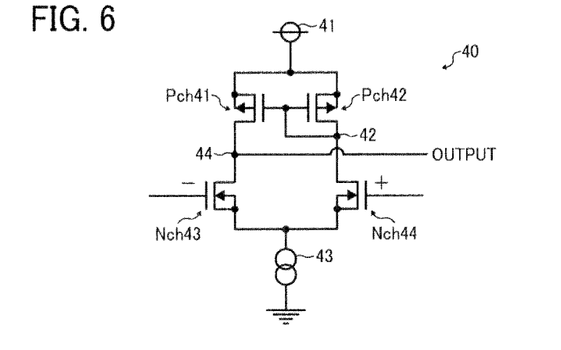
FIG. 6 is a circuit diagram illustrating a differential amplifier circuit serving as an internal circuit formed in the semiconductor chip in the semiconductor device shown in FIGS. 3 and 5.

FIG. 6 is a circuit diagram illustrating a differential amplifier circuit 40 serving as one example of the internal circuit formed in the semiconductor chip 5 in the semiconductor device 1(15). The differential amplifier circuit 40 includes a current mirror circuit, a pair of differential input transistors, a power source 41, and a constant current source 43. Transistors Pch41 and Pch42 constituted by positive channel (P-channel) metal oxide semiconductor filed effect transistors (MOSFET) function as the current mirror circuit, and transistors Nch43 and Nch44, constituted by negative channel (N-channel) MOSFET, function as the differential input transistors. Drains of transistors Nch43 and Nch44 (differential input transistors) are connected to the power source 41 via the transistors Pch41 and Pch42. Gates of the transistors Pch41 and Pch42 are connected to each other, and a junction node thereof is connected to the one of an input transistor, for example, a drain of the transistor Nch44, at a junction node 42. The transistors Pch41 and Pch42 constitute the current mirror circuit, which functions as a constant current load.

A gate of the transistor Nch43 is connected to an inverting input terminal (−) of the differential amplifier circuit 40, and a gate of the transistor Nch44 is connected to a non-inverting input terminal (+) thereof. Sources of the transistors Nch42 and Nch43 are connected to a ground potential via the constant current source 43. A junction node 44 connected between the transistor Pch41 and the transistor Nch43 functions as an output terminal of the differential amplifier circuit 40.

Herein, operation of the differential amplifier circuit 40 is described below. The voltage at the inverting input terminal (−) of the differential amplifier circuit 40 is set to a constant voltage. When a voltage at the non-inverting input terminal (+) is increased, that is, when a gate voltage of the transistor Nch44 is increased, the amount of current flowing through the transistor Nch44 is increased, the voltage at the junction node 42 is decreased, gate voltages of the transistors Pch41 and Pch42 are decreased, the amounts of current flowing through the transistors Pch41 and Pch42 are increased, and the amount of current flowing through the junction node 44 is increased. Since the voltage at the inverting input terminal (−), that is, a gate voltage of the transistor Nch43 is constant, on-resistance of the transistors Nch43 is constant, and the voltage at the junction node 44 is increased as the amount of current flowing through the junction node 44 is increased. Thus, as the voltage at the non-inverting input terminal is increased, the output voltage (output signal) of the differential amplifier circuit 40 is increased.

Conversely, when the voltage at the non-inverting input terminal (+), that is, the gate voltage of the transistor Nch44 is decreased, the amount of current flowing through the transistor Nch44 is decreased, the voltage at the junction node 42 is increased, the gate voltages of the transistors Pch41 and Pch42 are increased, the amounts of current flowing through the transistors Pch41 and Pch42 are decreased, and the amount of current flowing through the junction node 44 is decreased. Since the on-resistance of the transistor Nch43 is constant, the voltage at the junction node 4 is decreased as the amount of current flowing through the junction node 44 is decreased. Thus, as the voltage at the non-inverting input terminal (+) is decreased, the output voltage (output signal) of the differential amplifier circuit 40 is decreased.

The differential amplifier circuit 40 functions as an interior circuit that is formed in the semiconductor chip 5 of the semiconductor device 1(15). The transistors Pch41 and Pch42, constituting the current mirror circuits and the transistors Nch43 and Nch43 serve as the circuit elements in the semiconductor chip 5 arranged on the chip tab 3. The transistors Pch41 and Pch42 arranged on the chip tab 3 in the semiconductor device 1 are subjected to the same package stress in the same directions, which causes the electrical characteristics of the transistors Pch41 and Pch42 to fluctuate in the same direction and by the same amount. Similarly, the transistors Nch43 and Nch44 arranged on the chip tab 3 in the semiconductor device 1 are subjected to the same package stress in the same direction, which causes electrical characteristics of the transistors Nch43 and Nch44 to fluctuate in the same direction and by the same amount. In this case, compared to a state in which the semiconductor chip 5 is not resin molded yet, the output signal of the differential amplifier circuit 40 does not fluctuate. It is to be noted that, the PMOS transistors Pch41 and Pch42 may be formed by the NMOS transistors, and the NMOS transistors Nch43 and Nch44 may be formed by the PMOS transistors.

Figure 7:
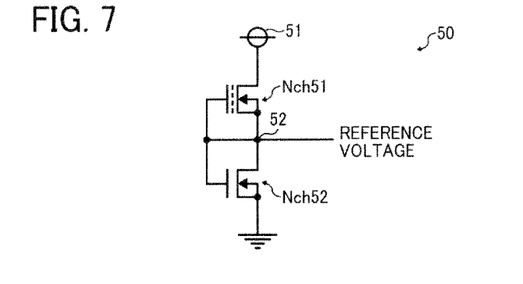
FIG. 7 is a circuit diagram illustrating a reference voltage generation circuit serving as the internal circuit formed in the semiconductor chip of the semiconductor device shown in FIGS. 3 and 5.

FIG. 7 is a circuit diagram illustrating a reference voltage generation circuit 50 serving as the internal circuit formed in the semiconductor chip 5 of the semiconductor device 1(15). The reference voltage generation circuit 50 includes a depletion-type MOSFET Nch51 constituting a constant current source and at least one of enhancement-type MOSFET Nch52 that is connected in serial to the depletion-type MOSFET Nch51. More specifically, in FIG. 7, the reference voltage generation circuit 50 includes a power source 51 and transistors Nch51 and Nch52. A drain of the transistor Nch51, constituted by Nch depletion-type MOSFET, is connected to the power source 51, and a gate and a source thereof are connected to each other at a junction node 52. The transistor Nch51 constitutes the constant current source. A gate and a drain of the transistor Nch52 constituted by Nch enhancement-type MOSFET are also connected to the junction node 52. A source of the transistor Nch52 is connected to the ground potential. A voltage at the junction node 52 functions as an output voltage (reference voltage Vref) of the reference voltage generation circuit 50. As the transistor Nch52 is activated by a constant current generated in the transistor Nch51, the voltage at the junction node 52, that is, the output voltage (Vref) of the reference voltage generation circuit 50 is determined by a threshold voltage of the transistor Nch52.

The reference voltage generation circuit 50 functions as the internal circuit formed in the semiconductor chip 5 of the semiconductor device 1(15). The transistors Nch51 and Nch52 constituting the reference voltage generation circuit 50 function as the circuit elements arranged on the chip tab 3.

The transistors Nch51 and N5ch2 arranged on the chip tab 3 in the semiconductor device 1 are subjected to the same package stress in the same direction, which causes electrical characteristics of the transistors Nch51 and Nch52 to fluctuate in the same direction and by the same amount. In this case, compared to a state in which the semiconductor chip 5 is not resin molded yet, the output signal (reference voltage Vref) of the reference voltage generation circuit 50 does not fluctuate.

Herein, the output voltage (reference voltage Vref) of the reference voltage generation circuit 50 in a state in which the package stress is not exerted is calculated as follows. The output voltage is Herein, |Vth(Nch51)| represents an absolute value of a threshold voltage Vth of the transistor Nch51, and |Vth(Nch52)| represents an absolute value of a threshold voltage Vth of the transistor Nch52.

$$Vref = |Vth(Nch52)| - |Vth(Nch51)| \quad (2)$$
$$= Vth(Nch52) - Vth(Nch51)$$

Herein, a case in which the package stress is exerted on these circuit elements is assumed. Although the threshold voltages of the transistors Nch51 and Nch52 fluctuate due to the package stress, as described above, the package stress on the chip tab 3 is uniform, the amount of fluctuation in the threshold voltages (electrical characteristics) of the transistors Nch51 and Nch52 caused by the package stress become equal.

If the fluctuation in the amount of threshold voltage of the transistors Nch51 and Nch 52 is set to ΔV, the reference voltage Vref (stress) of the reference voltage generation circuit 50 after the package stress is exerted is calculated as follows. Herein, Vref(stress) represents the reference voltage Vref when the package stress is exerted, |Vth (Nch51) (stress)| represents an absolute value of a threshold voltage of the transistor Nch51 when the package stress is exerted, and |Vth (Nch52) (stress)| represents an absolute value of a threshold voltage of the transistor Nch52 when the package stress is exerted.

$$Vref(\text{stress}) = |Vth(Nch52)(\text{stress})| - |Vth(Nch51)(\text{stress})| \quad (3)$$
$$= ((Vth(Nch52) + \Delta V) - (Vth(Nch51) + \Delta V)$$
$$= Vth(Nch52) - Vth(Nch51)$$

Thus, there is no change in the voltage Vref in the state in which the package stress is not exerted and the voltage Vref (stress) in the state in which the package stress is exerted as the output signal of the reference voltage generation circuit 50. Therefore, the output signal (reference voltage Vref) of the reference voltage generation circuit 50 does not fluctuate.

In the reference voltage generation circuit 50 shown in FIG. 7, the depletion-type MOSFET Nch51 is connected in serial to a single enhancement-type MOSFET Nch52. However, two or more enhancement-type MOSFET may be directly connected to the depletion-type MOSFET Nch51. Further, the transistors Nch51 and Nch52 may be formed by Pch transistors.

In addition, in the differential amplifier circuit 40, the reference voltage Vref generated in the reference voltage circuit 50 can be used for an output voltage of the differential amplifier circuit 40.

Figure 8:
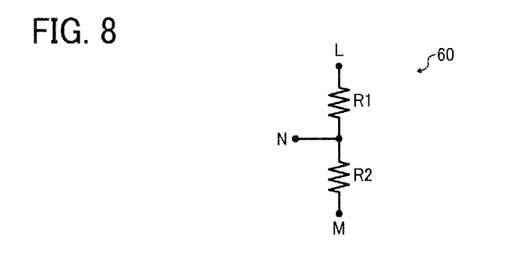
FIG. 8 is a circuit diagram illustrating a resistive dividing circuit serving as the internal circuit formed in the semiconductor chip of the semiconductor device shown in FIGS. 3 and 5.

FIG. 8 is a circuit diagram illustrating a resistive dividing circuit 60 serving as one example of the internal circuit formed in the semiconductor chip 5 of the semiconductor device 1(15). The resistive dividing circuit 60 includes at least one pair of resistors. In FIG. 8, resistors R1 and R2 are connected in serial between terminals L and M. A voltage at a terminal N connected between the resistors R1 and R2 constitute an output voltage of the resistive dividing circuit 60.

Figure 9:
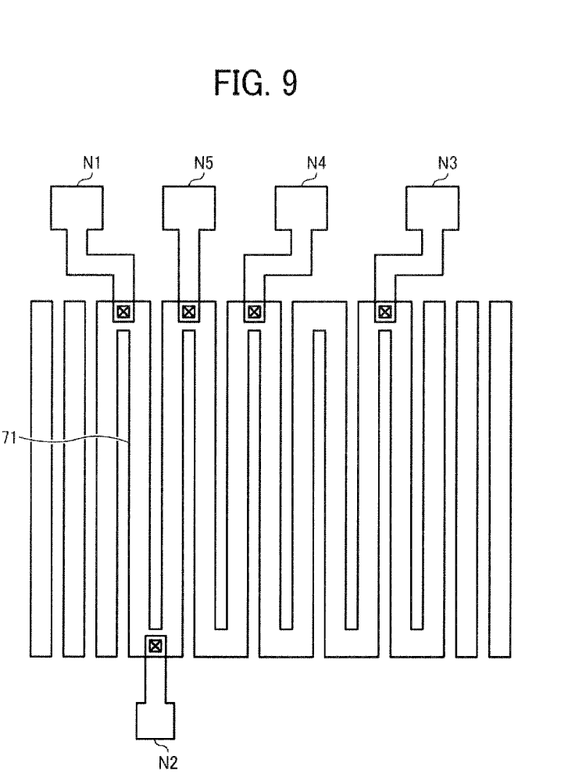
FIG. 9 is a plan view illustrating a layout of resistors in the resistive dividing circuit shown in FIG. 8.

FIG. 9 is a plan view illustrating a layout of the resistors R1 and R2 shown in FIG. 8. In FIG. 9, multiple resistive elements 71 are arranged in the resistor R1 or R2. The each resistive element 71 is formed by, for example, resistive alloy, resistive carbon, or resistive resin, etc. The single resistive element 71 serves as a unit resistor. Reference numerals N1 through N5 represent terminals to take electrical potential (resistances) from the resistive elements 71. The resistive dividing circuit 60 functions as the internal circuit formed in the semiconductor chip 5 of the semiconductor device 1. The resistive elements 71 function as the circuit elements in the semiconductor chip 5 arranged on the chip tab 3.

For example, when the terminals N1 and N2 are selected, resistance R0 that is a value corresponding to single resistive element 71 is obtained. When the terminals N2 and N5 are selected, the resistance R0 that is a value corresponding to single resistive element is obtained. When the terminals N4 and N5 are selected, resistance 2R0 that is a value corresponding to two resistive elements 71 is obtained. When the terminals N3 and N4 are selected, resistance 4R0 that is a value corresponding to four resistive elements 71 is obtained.

Using the resistance, one example in which the resistance is taken out by dividing a potential difference between the terminals N and M and outputting from the terminal N is described below. For example, setting the voltage at the terminal L to 3.0 V (volt) and the voltage at the terminal M to 1.5V, 1.5 V is taken from the terminal N. In this case, the terminals N1 and N2 are wired and the resistance R0 is used as resistance of the resistor R1, and the terminals N2 and N5 are wired and the resistance R0 is used as resistance of the resistor R2, thereby 1.5 V can be obtained. That is, a voltage V(N) at the terminal N is represented by the following formula 4:

$$V(N) = \frac{R2}{R1+R2} \times 3.0V \quad (4)$$
$$= \frac{R0}{R0+R0} \times 3.0V$$
$$= \frac{1}{2} \times 3.0V = 1.5V$$

Herein, a case in which the package stress is exerted on the resistive elements 71 is assumed. Although the resistance of the resistive elements 71 fluctuates respectively by being subjected to the package stress, the amount of fluctuation between the resistors R1 and R2 that are formed by the two resistive elements 71 respectively are identical because the strength of the package stress is uniform across the chip tab 3. Herein, V (N: stress) represents the voltage V at the terminal N after the package stress is exerted, R1 (stress) represents the resistance of the resistor R1 after the package stress is exerted, and R1 (stress) represents the resistance of the resistor R1 after the package stress is exerted. Assuming the fluctuation amount to "r", the voltage V at the terminal N after the package stress is exerted is calculated as follows:

$$V(N: stress) = \frac{R2(stress)}{R1(stress)+R(stress)} \times 3.0V \quad (5)$$
$$= \frac{R0+r}{(R0+r)+(R0+r)} \times 3.0V$$
$$= \frac{R0+r}{2\times(R0+r)} \times 3.0V$$
$$= \frac{1}{2} \times 3.0V = 1.5V$$

Thus, the output voltage V(N) of the resistive dividing circuit 60 in a state in which the package stress is not exerted and the output voltage V(N: stress) of the resistive dividing circuit 60 in a state in which the package stress is exerted, an output voltage Vref of the resistive dividing circuit 60 does not vary. Thus, the output signal (output voltage V(N)) of the resistive dividing circuit 60 does not fluctuate. In this example, although the voltage at the terminals L and M gets half (½), any dividing ratio, such as one-third, or one-fifth may be similarly acceptable.

Figure 10:
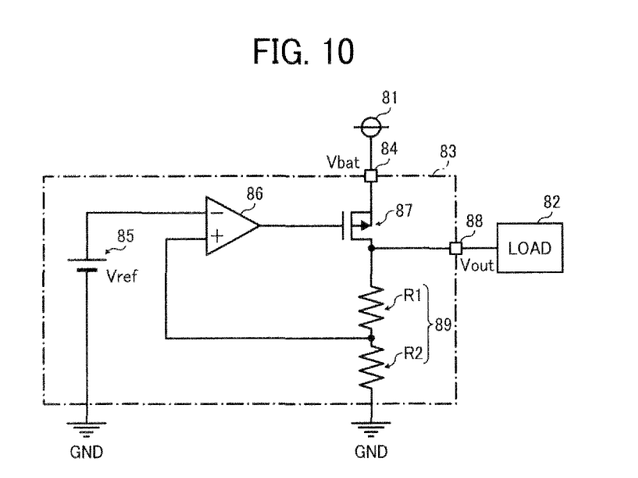
FIG. 10 is a circuit diagram illustrating one example of the semiconductor device shown in FIGS. 3 and 5 including a constant voltage generation circuit.

FIG. 10 is a circuit diagram illustrating the semiconductor device 1 including a constant voltage generation circuit 83. The constant voltage generation circuit 83 is provided to reliably supply power from a power source 81 to the load 81. The constant voltage generation circuit 83 receives an input voltage Vin and outputs an output voltage Vout. The constant voltage generation circuit 83 includes an output driver 87, a resistive dividing circuit 89, a reference voltage generation circuit 85, a differential amplifier circuit 86, an input terminal 84, and an output terminal 88. The output driver 87, constituted by a transistor, controls an output voltage Vout when an input voltage Vin is converted into a predetermined voltage as the output voltage Vout and the output voltage Vout is output. The resistive dividing circuit 89, constituted by dividing resistors R1 and R2, divides an output voltage for output as a dividing voltage. The reference voltage generation circuit 85, serving as a reference voltage source, supplies a reference voltage Vref. The differential amplifier circuit 86 compares the dividing voltage from the resistive dividing circuit 89 with the reference voltage from the reference voltage generation circuit 85 and control the output driver 87 based on the comparison result.

In the constant voltage generation circuit 83, an output terminal of the differential amplifier circuit 86 is connected to a gate of the output driver 87, a reference voltage Vref generated in the reference voltage generation circuit 85 is applied to an inverting input terminal (−) of the differential amplifier circuit 86, and a dividing voltage generated by dividing the output voltage Vout by the dividing resistors R1 and R2 is applied to a non-inverting input terminal (+) thereof. The differential amplifier circuit 86 adjusts that the dividing voltage from the dividing resistors R1 and R2 sets equal to the reference voltage Vref.

In the constant voltage generation circuit 83, at least one of the reference voltage generation circuit 85, the differential amplifier circuit 86, and the resistive divider circuit 89 functions as the internal circuit formed in the semiconductor chip 5 placed on the chip tab 3. For example, the reference voltage generation circuit 85 is formed by the reference voltage generation circuit 50 shown in FIG. 7. The differential amplifier circuit 86 functions as the internal circuit and is formed by, for example, the differential amplifier circuit 40 shown in FIG. 6. The resistive divider circuit 89 constituted by the resistors R1 and R2 functions as the internal circuit and is formed by, for example, the resistive dividing circuit 60 shown in FIGS. 8 and 9.

The reference voltage generation circuit, the differential amplifier circuit, and the resistive divider circuit functioning as the internal circuits can prevent the fluctuation in the output signal caused by the package stress, and as a result, the constant voltage generation circuit 83 can prevent the fluctuation in the output signal due to the package stress.

Figure 11:
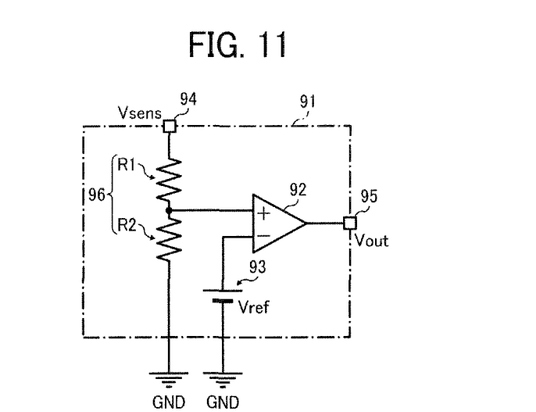
FIG. 11 is a circuit diagram illustrating another example of the semiconductor device shown in FIGS. 3 and 5 including a voltage detection circuit.

FIG. 11 is a circuit diagram illustrating the semiconductor device 1 including a voltage detection circuit 91. The voltage detection circuit 91 has an input terminal 91 and an output terminal 95. The voltage detection circuit 91 includes a resistive dividing circuit 96, a reference voltage generation circuit 93, and a differential amplifier circuit 92. The resistive dividing circuit 96 divides an input voltage Vsens for output as a dividing voltage. The reference voltage generation circuit 93 supplies a reference voltage Vref. The differential amplifier circuit 92 compares the dividing voltage from the resistive dividing circuit 96 with the reference voltage Vref from the reference voltage generation circuit 93. In the voltage detection circuit 91, reference numeral 92 represents a differential amplifier circuit (or an operational amplifier) whose inverting input terminal (−) is connected to the reference voltage generation circuit 93, and the reference voltage Vref is applied to the inverting input terminal (−). A input voltage Vsense at the input terminal 94 that should be measured is divided by dividing resistors R1 and R2, the divided voltage is input to an non-inverting input terminal (+) of the differential amplifier circuit 92. The output signal of the differential amplifier circuit 92 is output through the output terminal 95 as an output voltage Vout.

When the voltage Vsens at the input terminal 94 to be measured is high and the voltage divided by the dividing resistors R1 and R2 is higher than the reference voltage Vref, the voltage detection circuit 91 keeps the output signal Vout of the differential amplifier circuit 92 at high level. Conversely, when the voltage Vsense at the input terminal Vsens to be measured is decreased and the voltage divided by the dividing resistors R1 and R2 becomes lower than the reference voltage Vref, the voltage detection circuit 91 turns the output signal of the differential amplifier circuit 92 to low.

In the voltage detection circuit 91, at least one of the reference voltage generation circuit 93, the differential amplifier circuit 92, and the resistive dividing circuit 96 functions as the internal circuit formed in the semiconductor chip 5 placed on the chip tab 3. For example, the reference voltage generation circuit 93 is formed by the reference voltage generation circuit 50 shown in FIG. 7. The differential amplifier circuit 92 functions as the internal circuit and is formed by, for example, the differential amplifier circuit 40 shown in FIG. 6. The resistive dividing circuit 96, constituted by the resistors R1 and R2, functions as the internal circuit and is formed by, for example, the resistive dividing circuit 60 shown in FIGS. 8 and 9.

The reference voltage generation circuit, the differential amplifier circuit, and the resistive dividing circuit functioning as the internal circuits can prevent the fluctuation in the output signal caused by the package stress, and as a result, the voltage detection circuit 91 can prevent the fluctuation in the output signal due to the package stress.

As described above, although the MOSFET are used as the transistors in the present disclosure, a bipolar transistor may used as the transistors in the above-described embodiments.

In the semiconductor device according to the present disclosure, the internal circuit and the circuit elements are just as one example, the configuration and members of the internal circuit and the circuit elements are not limited to above-described embodiments.

In addition, the material and shape of the semiconductor device are not limited to the above-described embodiments, and various modifications and improvements in the material and shape of the semiconductor device are possible without departing from the spirit and scope of the present disclosure.

Numerous additional modifications and variations are possible in light of the above teachings. It is therefore to be understood that, within the scope of the appended claims, the disclosure of this patent specification may be practiced otherwise than as specifically described herein.

What is claimed is:

1. A semiconductor device comprising:
   a semiconductor chip in which an internal circuit is formed, with the internal circuit having an output signal that fluctuates due to variation of fluctuation in electrical characteristics of multiple circuit elements constituting the internal circuit;
   a chip tab on which the semiconductor chip is mounted, with the semiconductor chip completely overlapping the chip tab and the circuit elements in the semiconductor chip arranged on the chip tab, and
   encapsulation resin within which the semiconductor chip and the chip tab are sealed,
   wherein a horizontal surface area of the chip tab is smaller than that of the semiconductor chip, and
   a distance between a periphery of the chip tab and a periphery of the semiconductor chip is sufficient to cause stress exerted on the semiconductor chip by the encapsulation resin to be uniform across the horizontal surface area of the chip tab.

2. The semiconductor device according to claim 1, wherein the internal circuit is a differential amplifier circuit comprising a current mirror circuit and a pair of differential input transistors, and
   the circuit elements comprise a pair of transistors constituting the current mirror circuit and the pair of differential input transistors.

3. The semiconductor device according to claim 1, wherein the internal circuit is a reference voltage generation circuit comprising a depletion-type MOSFET constituting a constant current source and at least one enhancement-type MOSFET that is connected in serial to the depletion-type MOSFET, and
   the circuit elements comprise the depletion-type MOSFET and the at least one enhancement-type MOSFET.

4. The semiconductor device according to claim 3, wherein a reference voltage generated in the reference voltage circuit is used for an output voltage of a differential amplifier circuit having a current mirror circuit and a pair of differential input transistors, and
   the circuit elements comprise a pair of transistors constituting the current mirror circuit and the pair of differential input transistors.

5. The semiconductor device according to claim 1, wherein the internal circuit is a resistive dividing circuit comprising at least one pair of resistors as the circuit elements.

6. The semiconductor device according to claim 1, wherein the internal circuit is a voltage detection circuit to detect an input voltage comprising:
   a resistive dividing circuit to divide an input voltage for output as a dividing voltage;
   a reference voltage generation circuit to supply a reference voltage; and
   a differential amplifier circuit to compare the dividing voltage from the resistive dividing circuit with the reference voltage from the reference voltage generation circuit.

7. The semiconductor device according to claim 6, wherein the resistive dividing circuit comprising at least one pair of resistors as the circuit elements.

8. The semiconductor device according to claim 6, wherein the reference voltage generation circuit comprises a depletion-type MOSFET constituting a constant current source and at least one enhancement-type MOSFET that is connected in serial to the depletion-type MOSFET, and the circuit elements comprise the depletion-type MOSFET and the at least one enhancement-type MOSFET.

9. The semiconductor device according to claim 6, wherein the differential amplifier circuit comprises a current minor circuit and a pair of differential input transistors, and the circuit elements comprise a pair of transistors constituting the current mirror circuit and the pair of differential input transistors.

10. The semiconductor device according to claim 1, wherein the internal circuit is a constant voltage generation circuit to generate a constant voltage comprising:
    an output driver to control an output voltage when an input voltage is converted into a predetermined voltage as the output voltage and the output voltage is output
    a resistive dividing circuit to divide an output voltage for output as a dividing voltage;
    a reference voltage generation circuit to supply a reference voltage; and
    a differential amplifier circuit to compare the dividing voltage from the resistive dividing circuit with the reference voltage from the reference voltage generation circuit and control the output driver based on the comparison result.

11. The semiconductor device according to claim 10, wherein the resistive dividing circuit comprising at least one pair of resistors as the circuit elements.

12. The semiconductor device according to claim 10, wherein the reference voltage generation circuit comprises a depletion-type MOSFET constituting a constant current source and at least one enhancement-type MOSFET that is connected in serial to the depletion-type MOSFET, and the circuit elements comprise the depletion-type MOSFET and the at least one enhancement-type MOSFET.

13. The semiconductor device according to claim 10, wherein the differential amplifier circuit comprises a current mirror circuit and a pair of differential input transistors, and the circuit elements comprise a pair of transistors constituting the current mirror circuit and the pair of differential input transistors.

14. A semiconductor device comprising:
    a semiconductor chip in which an internal circuit is formed, with the internal circuit having an output signal that fluctuates due to variation of fluctuation in electrical characteristics of multiple circuit elements constituting the internal circuit;
    a chip tab on which the semiconductor chip is mounted, with the semiconductor chip completely overlapping the chip tab and the circuit elements in the semiconductor chip arranged on the chip tab, and
    encapsulation resin within which the semiconductor chip and the chip tab are sealed, wherein
    a horizontal surface area of the chip tab is smaller than that of the semiconductor chip,
    the semiconductor chip is disposed relative to the chip tab such that a center of gravity of the chip tab is offset from a center of gravity of the semiconductor chip, and
    a distance between a periphery of the chip tab and a periphery of the semiconductor chip is sufficient to cause stress exerted on the semiconductor chip by the encapsulation resin to be uniform across the horizontal surface area of the chip tab.

* * * * *